(12) United States Patent
Liu

(10) Patent No.: US 12,293,788 B2
(45) Date of Patent: May 6, 2025

(54) METHOD FOR LOCATING BOUNDARY PAGE LINE IN MEMORY DEVICE, MEMORY DEVICE, AND MEMORY SYSTEM THEREOF

(71) Applicant: YANGTZE MEMORY TECHNOLOGIES CO., LTD., Wuhan (CN)

(72) Inventor: Jingsheng Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 207 days.

(21) Appl. No.: 18/092,115

(22) Filed: Dec. 30, 2022

(65) Prior Publication Data
US 2024/0161827 A1    May 16, 2024

(30) Foreign Application Priority Data

Nov. 16, 2022   (CN) .......................... 202211435422.2

(51) Int. Cl.
*G11C 16/08*   (2006.01)
*G11C 16/04*   (2006.01)
*G11C 16/10*   (2006.01)

(52) U.S. Cl.
CPC .......... *G11C 16/08* (2013.01); *G11C 16/0483* (2013.01); *G11C 16/10* (2013.01)

(58) Field of Classification Search
CPC ..... G11C 16/08; G11C 16/0483; G11C 16/10; G11C 16/14; G06F 13/1668
See application file for complete search history.

(56) References Cited

U.S. PATENT DOCUMENTS

| | | | |
|---|---|---|---|
| 2009/0067241 A1* | 3/2009 | Gorobets ............ | G06F 11/1441 365/185.04 |
| 2016/0268000 A1* | 9/2016 | Thompson ............. | G11C 16/20 |
| 2017/0038985 A1* | 2/2017 | Chen ........................ | G11C 8/20 |
| 2017/0337972 A1* | 11/2017 | Lee ........................ | G06F 3/0634 |

* cited by examiner

Primary Examiner — Jerome Leboeuf
(74) Attorney, Agent, or Firm — BAYES PLLC

(57) ABSTRACT

A method of operating the memory system includes determining a boundary page line to be found, the boundary page line including a first page line of page lines in a programming order. States of pages forming the first page line of the page lines in the programming order are all erased state. The method also includes obtaining an address of a frozen page line, the frozen page line including a first page line of a first page line group. States of at least part of pages forming the first page line of the first page line group are erased state. The method further includes determining that states of pages forming the frozen page line are all programmed state. The method further includes determining the page line group to which the boundary page line belongs according to the address of the frozen page line. The method further includes determining an address of the boundary page line from the page line group to which the boundary page line belongs.

20 Claims, 12 Drawing Sheets

FIG. 9

| | | a first page line | | | | a middle page line | | | a last page line | |
|---|---|---|---|---|---|---|---|---|---|---|
| | | ⇩ | | | | ⇩ | | | ⇩ | |
| step 1 | a page line | 0 | 1 | 2 | 3 | 4 | 5 | 6 | 7 | 8 |
| | state | non-empty | non-empty | non-empty | non-empty | non-empty | non-empty | empty | empty | empty |

| | | | | | | | a first page line | a middle page line | a last page line |
|---|---|---|---|---|---|---|---|---|---|
| | | | | | | | ⇩ | ⇩ | ⇩ |
| step 2 | a page line | 0 | 1 | 2 | 3 | 4 | 5 | 6 | 7 | 8 |
| | state | non-empty | non-empty | non-empty | non-empty | non-empty | non-empty | empty | empty | empty |

FIG. 10

METHOD FOR LOCATING BOUNDARY PAGE LINE IN MEMORY DEVICE, MEMORY DEVICE, AND MEMORY SYSTEM THEREOF

CROSS-REFERENCE TO RELATED APPLICATIONS

This application claims the benefit of priority to Chinese Application No. 202211435422.2, filed on Nov. 16, 2022, which is incorporated herein by reference in its entirety.

TECHNICAL FIELD

The disclosure relates to the field of semiconductor technology, and in particular to a memory device and operation method thereof, a memory system and operation method thereof.

BACKGROUND

A memory device is a memory apparatus used to preserve information in modern information technology. As a typical non-volatile semiconductor memory, NAND (Not-And) flash memory has become a mainstream product in the storage market due to its high storage density, controllable production cost, suitable programming, and erasing speed and retention characteristics.

With the continuous improvement of requirements for memory devices, how to improve the recovery efficiency of memory devices in case of accidental power failure has become one of the technical problems that need to be solved urgently in this field at the present stage.

SUMMARY

According to a first aspect of an implementation of the disclosure, a memory system is provided. The memory system comprises a memory device and a memory controller coupled to the memory device; the memory device includes at least one of dies, and the die includes a memory array; wherein The memory array includes a plurality of memory planes, the memory plane includes a plurality of memory blocks, and the memory block includes a plurality of pages; a plurality of pages located at the same position in each of memory planes in at least one die form a page line, and a plurality of adjacent page lines form a page line group; the memory controller is configured to: determine a boundary page line to be found, the boundary page line including a first page line of the page lines in a programming order, wherein states of pages forming the first page line of the page lines in the programming order are all erased state; obtain an address of a frozen page line, the frozen page line including a first page line of a first page line group, wherein states of at least part of pages forming the first page line of the first page line group are erased state; determine that states of pages in the frozen page line are all programed state; determine the page line group which the boundary page line belongs to according to the address of the frozen page line; and determine an address of the boundary page line from the page line group which the boundary page line belongs to.

In the scheme described above, the memory controller is configured to determine the address of the boundary page line from the page line group which the boundary page line belongs to by binary search.

In the scheme described above, the memory controller is configured to: determine an address of a first page line and an address of a last page line of the page line group which the boundary page line belongs to; take the first page line of the page line group to which the boundary page line belongs as the first page line for searching by binary search, and take the last page line of the page line group to which the boundary page line belongs as the last page line for searching by binary search; determine a first page line of the page line group to which the boundary page line belongs, wherein states of pages forming the first page line of the page line group to which the boundary page line belongs include an erased state; and determine an address of the boundary page line according to the first page line of the page line group which the boundary page line belongs to.

In the scheme described above, the memory controller is configured to: determine that states of pages forming the first page line of the page line group which the boundary page line belongs to are all erased state; and determine the first page line of the page line group which the boundary page line belongs to be the boundary page line as the boundary page line.

In the scheme described above, the memory controller is configured to: determine that states of part of pages forming the first page line of the page line group which the boundary page line belongs to are erased state; and determine the address of the boundary page line according to a programming type of memory cells in the memory block and the address of the first page line of the page line group which the boundary page line belongs to. In the scheme described above, the memory controller is configured to: determine that the states of the pages forming the frozen page line are all erased state; and determine the boundary page line to be the frozen page line.

In the scheme described above, the memory controller is configured to: determine that the states of part of the pages forming the frozen page line are erased state; and determine the address of the boundary page line according to a programming type of memory cells in the memory block and the address of the frozen page line.

In the scheme described above, the memory controller is configured to sum the address of the frozen page line and the number of stored bits of the memory cells in the memory block as the address of the boundary page line.

In the scheme described above, the memory controller is configured to: perform a program operation on each of the page lines according to the programming order; and in response to a state of each of the page lines in a current page line group being programmed state, store an address of a first page line of a page line group next to the current page line group in a global directory of pages as the address of the frozen page line.

In the scheme described above, the memory system comprises a memory card or a solid-state drive.

According to a second aspect of an implementation of the disclosure, a memory device is provided. The memory device comprises at least one die, and the die includes a memory array and peripheral circuits coupled to the memory array; wherein the memory array includes memory planes, each of the memory plane includes memory blocks, and each of the memory block includes pages; pages located at the same position in each of the memory planes in at least one die form a page line, and adjacent page lines form a page line group; the peripheral circuit is configured to: determine a boundary page line to be found, the boundary page line including a first page line of the page lines in a programming order, wherein states of pages forming the first page line of the page lines in the programming order are all erased state; obtain an address of a frozen page line, the frozen page line including a first page line of a first page line group, wherein, wherein states of at least part of pages forming the first page line of the first page line group are erased state in a first page line group; determine that states of pages forming the frozen page line are all programed state; determine the page line group which the boundary page line belongs to according to the address of the frozen page line; and determine an address of the boundary page line from the page line group which the boundary page line belongs to.

In the scheme described above, the memory device comprises a three-dimensional NAND type memory.

According to a third aspect of an implementation of the disclosure, a method for operating a memory system is provided. The method comprises: determining a boundary page line to be found, the boundary page line including a first page line of page lines in a programming order, wherein states of pages forming the first page line of the page lines in the programming order are all erased state; obtaining an address of a frozen page line, the frozen page line including a first page line of a first page line group, wherein states of at least part of pages forming the first page line of the first page line group are erased state; determining that states of pages forming the frozen page line are all programed state; determining the page line group which the boundary page line belongs to according to the address of the frozen page line; and determining an address of the boundary page line from the page line group which the boundary page line belongs to.

In the scheme described above, determining the address of the boundary page line from the page line group which the boundary page line belongs to, comprises determining the address of the boundary page line from the page line group which the boundary page line belongs to by binary search.

In the scheme described above, determining an address of the boundary page line from the page line group which the boundary page line belongs to by binary search comprise: determining an address of a first page line and an address of a last page line of the page line group which the boundary page line belongs to; taking the first page line of the page line group to which the boundary page line belongs as the first page line for searching by binary search, and taking the last page line of the page line group to which the boundary page line belongs as the last page line for searching by binary search; determining a first page line of the page line group to which the boundary page line belongs, wherein states of pages forming the first page line of the page line group to which the boundary page line belongs include an erased state; and determining an address of the boundary page line according to the first page line of the page line group which the boundary page line belongs to.

In the scheme described above, determining an address of the boundary page line according to the first page line in which states of pages include an erased state within the page line group which the boundary page line belongs to, comprises: determining that states of pages forming the first page line of the page line group which the boundary page line belongs to are all erased state; and determining the first page line of the page line group which the boundary page line belongs to as the boundary page line.

In the scheme described above, determining an address of the boundary page line according to the first page line in which states of pages include an erased state within the page line group which the boundary page line belongs to, comprises: determining that states of part of pages forming the first page line of the page line group which the boundary page line belongs to are erased state; and determining the address of the boundary page line according to a programming type of memory cells in a memory block and the address of the first page line of the page line group which the boundary page line belongs to.

In the scheme described above, the method further comprises: determining that the states of the pages in the frozen page line are all erased state; and determining the boundary page line to be the frozen page line.

In the scheme described above, the method further comprises: determining that the states of part of the pages forming the frozen page line are erased state; and determining the address of the boundary page line according to a programming type of memory cells in a memory block and the address of the frozen page line.

In the scheme described above, determining an address of the boundary page line according to programming type of memory cells in a memory block and the address of the frozen page line comprises: summing the address of the frozen page line and the number of stored bits of the memory cells in the memory block as the address of the boundary page line.

In the scheme described above, the method further comprises: performing a program operation on each of page lines according to the programming order before determining a boundary page line to be found; and when state of each of page lines in a current page line group is programmed state, storing an address of a first page line in a page line group next to the current page line group in the global directory of page as the address of the frozen page line.

According to a fourth aspect of an implementation of the disclosure, a method for operating a memory device is provided. The method comprises: determining a boundary page line to be found, the boundary page line including a first page line in which states of the pages are all erased state in the page lines in a programming order; obtaining an address of a frozen page line, the frozen page line including a first page line in which states of at least part of the pages are erased state in a first page line group; determining that the states of the pages in the frozen page line are all programed state; determining the page line group which the boundary page line belongs to according to the address of the frozen page line; and determining an address of the boundary page line from the page line group which the boundary page line belongs to.

BRIEF DESCRIPTION OF THE DRAWINGS

FIG. 9 is a schematic diagram of a memory device in a memory system according to an implementation of the disclosure;

FIG. 10 is a schematic diagram of a search process by binary search according to an implementation of the disclosure.

DETAILED DESCRIPTION

Figure 1:
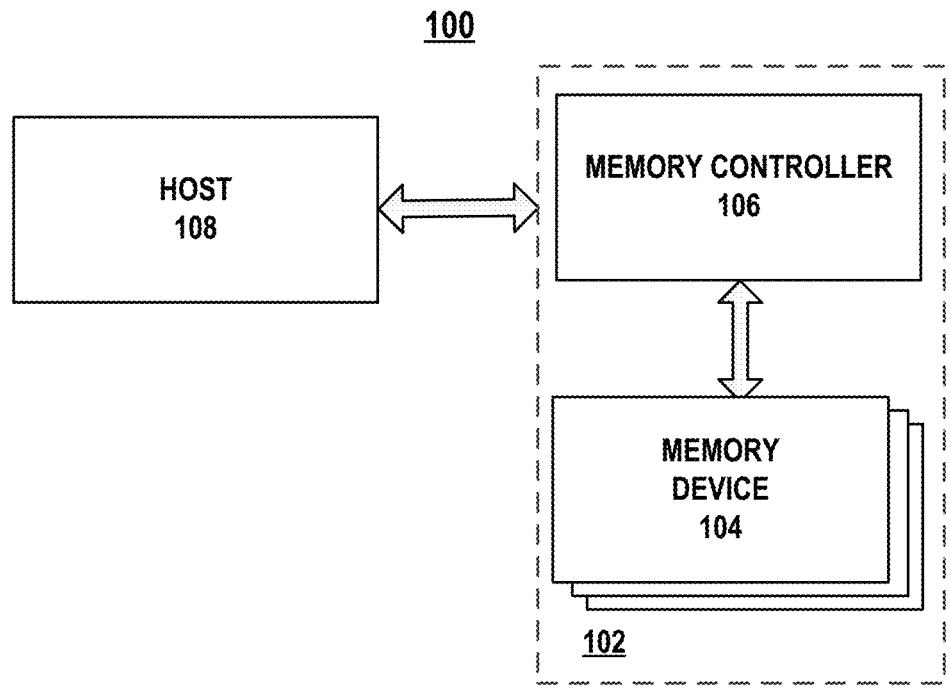
FIG. 1 is a schematic diagram of an exemplary system with a memory system according to an implementation of the disclosure.

Exemplary implementations of the disclosure will be described in more detail below with reference to accompanying drawings. Although exemplary implementations of the disclosure are shown in accompanying drawings, it may be understood that the disclosure may be implemented in various ways and should not be limited to the specific implementations set forth herein. Rather, these implementations are provided so that the disclosure may be more thoroughly understood and the scope of the disclosure may be fully conveyed to those skilled in art.

In the following description, numerous specific details are given in order to provide a more thorough understanding of the disclosure. However, it will be apparent to one skilled in art that the disclosure may be practiced without one or more of these details. In other examples, in order to avoid confusion with the disclosure, some technical features known in art are not described; that is, not all features of actual implementation are described here, and well-known functions and structures are not described in detail.

In accompanying drawings, the size of a layer, a region, an element, and their relative sizes may be exaggerated for clarity. Like reference numerals refer to like elements throughout the disclosure.

It will be understood that when an element or layer is referred to as being "on," "adjacent to," "connected to," or "coupled to" another element or layer, it may be directly on, adjacent to, connected to or coupled to another element or layer, or intermediate elements or layers may be present. In contrast, when an element is referred to as being "directly on," "directly adjacent to," "directly connected to," or "directly coupled to" another element or layer, there is no intermediate elements or layers present. It will be understood that, although the terms first, second, third etc., may be used to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below may be presented as a second element, component, region, layer or part without departing from teachings of the disclosure. While a second element, component, region, layer or part is discussed, it does not indicate that a first element, component, region, layer or part necessarily presents in the disclosure.

The terms related to the relationship in space such as "beneath," "below," "lower," "under," "above," "on," etc., may be used herein for ease of description to describe relationship between one element or feature and another element(s) or feature(s) as illustrated in the figures. It will be understood that the terms related to the relationship in space are intended to contain different orientations of the device in use or operations, in addition to the orientation depicted in the figures. For example, if the device in the figures is turned over, an element or a feature described as "below," or "beneath" or "under" another element or feature would then be oriented "on" another element or feature. Thus, exemplary terms "below" and "under" may include both orientations of up and down. A device may be otherwise oriented (rotated 90 degrees or at other orientations), and the spatial descriptors used herein should be interpreted correspondingly.

A term used herein is for the purpose of describing a particular implementation only and is not to be considered as limitation of the disclosure. As used herein, the singular forms "a," "an," and "said/the" are intended to include the plural forms as well, unless the context clearly dictates otherwise. It should also be understood that the terms "consists of" and/or "comprising" when used in this description, the presence of stated features, integers, steps, operations, elements and/or parts is determined, but do not exclude the presence or addition of one or more other features, integers, steps, operations, elements, parts and/or groups. As used herein, the term "and/or" includes any and all combinations of associated listed items.

In order to understand the characteristics and technical content of implementations of the disclosure in more detail, implementations of implementations of the disclosure will be described in detail below in conjunction with accompanying drawings. However, accompanying drawings are for reference and description only, and are not intended to limit implementations of the disclosure.

Memory devices in implementations of the disclosure include but are not limited to a three-dimensional NAND memory, and for ease of understanding, a three-dimensional NAND memory is used as an example for illustration.

The present disclosure provides a memory device and operation method thereof, a memory system and operation method thereof, and includes: determining a boundary page line to be found, the boundary page line including a first page line in which states of the pages are all erased state in the page lines in a programming order; obtaining an address of a frozen page line, the frozen page line including a first page line in which states of at least part of the pages are erased state in a first page line group; determining that the states of the pages in the frozen page line are all programed state; determining the page line group which the boundary page line belongs to according to the address of the frozen page line; determining an address of the boundary page line from the page line group which the boundary page line belongs to. In an implementation of the disclosure, page lines are divided into a plurality of page line groups. Each of page lines groups contains a plurality of page lines. Searching for boundary page lines within the scope of the page line group after power-off may narrow down the range of searching for boundary page lines, reduce the number of searching, and thus improve the efficiency of recovering from powering off.

FIG. 1 illustrates a block diagram of an exemplary system 100 having memory devices in accordance with some aspects of the disclosure. The system 100 may be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 may include a host 108 and a memory system 102, and the memory system 102 has one or more memory devices 104 and a memory controller 106. The host 108 may be a processor of an electronic device (e.g., a central processing unit (CPU)) or a system on chip (SoC) (e.g., an application processor (AP)). Host 108 may be configured to send data to or receive data from memory device 104.

According to some implementations, memory controller 106 is coupled to memory device 104 and host 108, and is configured to control memory device 104. Memory controller 106 may manage data stored in memory device 104 and communicate with host 108. In some implementations, memory controller 106 is designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc. In some implementations, the memory controller 106 is designed to operate in high duty cycle environments such as SSD or embedded multimedia card (eMNIC), where SSDs or eMMCs are used as data storage for mobile devices such as smartphone, tablet computer, laptop computer, and enterprise memory array.

Memory controller 106 may be configured to control operations of memory device 104, e.g., read, erase and program operations. Memory controller 106 may also be configured to manage various functions related to data stored or to be stored in memory device 104, including but not limited to bad memory block management, garbage collection, logical-to-physical address translation, wear leveling, etc. In some implementations, memory controller 106 is also configured to process error correction code (ECC) related to data read from or written to memory device 104. Memory controller 106 may also perform any other suitable functions, e.g., formatting memory device 104. Memory controller 106 may communicate with external devices (e.g., host 108) according to a particular communication protocol. For example, the memory controller 106 may communicate with external devices through at least one of various interface protocols, e.g., USB protocol, MMC protocol, Peripheral Component Interconnect (PCI) protocol, PCI Express (PCI-E) protocol, advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

Figure 2A:
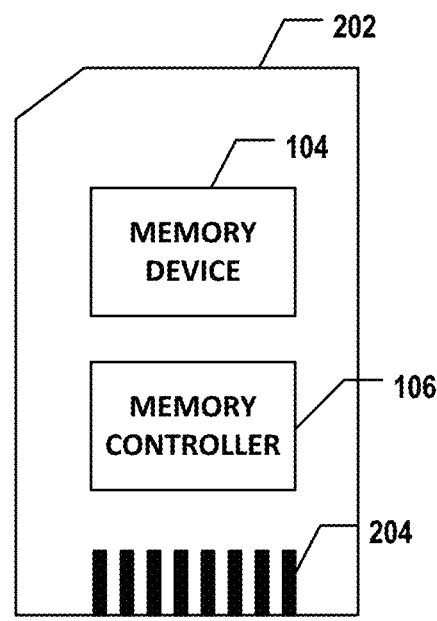
FIG. 2a is a schematic diagram of an exemplary memory card with a memory system according to an implementation of the disclosure.
Figure 2B:
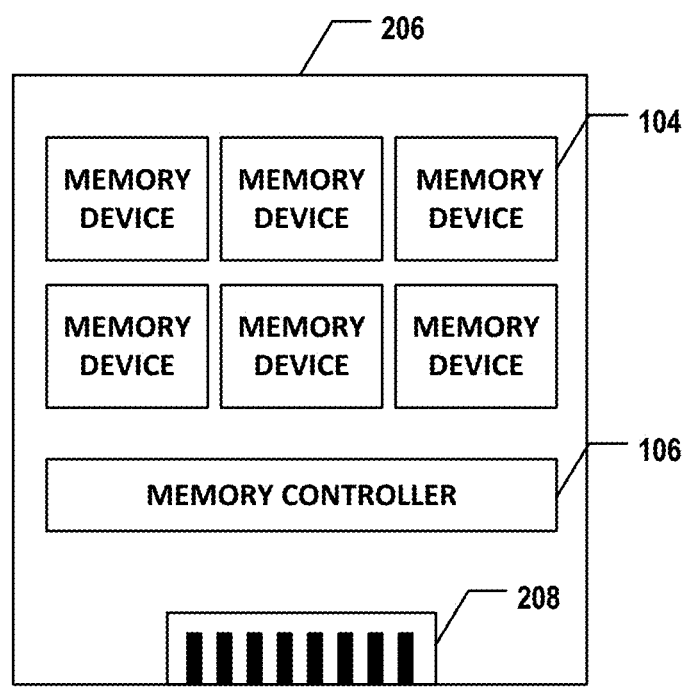
FIG. 2b is a schematic diagram of an exemplary solid-state drive with a memory system according to an implementation of the disclosure.

Memory controller 106 and one or more memory devices 104 may be integrated into various types of storage devices, e.g., included in the same package (e.g., Universal Flash Storage (UFS) package or eMMC package). That is, memory system 102 may be implemented and packaged into different types of end electronic products. In one example as shown in FIG. 2a, memory controller 106 and a single memory device 104 may be integrated into a memory card 202. Memory card 202 may include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 may further include a memory card connector 24 coupling memory card 202 with a host (e.g., host 108 in FIG. 1). In another example as shown in FIG. 2b, memory controller 106 and a plurality of memory devices 104 may be integrated into SSD 206. SSD 206 may further include an SSD connector 208 coupling the SSD 206 with a host (e.g., host 108 in FIG. 1). In some implementations, the storage capacity and/or operating speed of SSD 206 is greater than the storage capacity and/or operating speed of memory card 202.

Figure 3A:
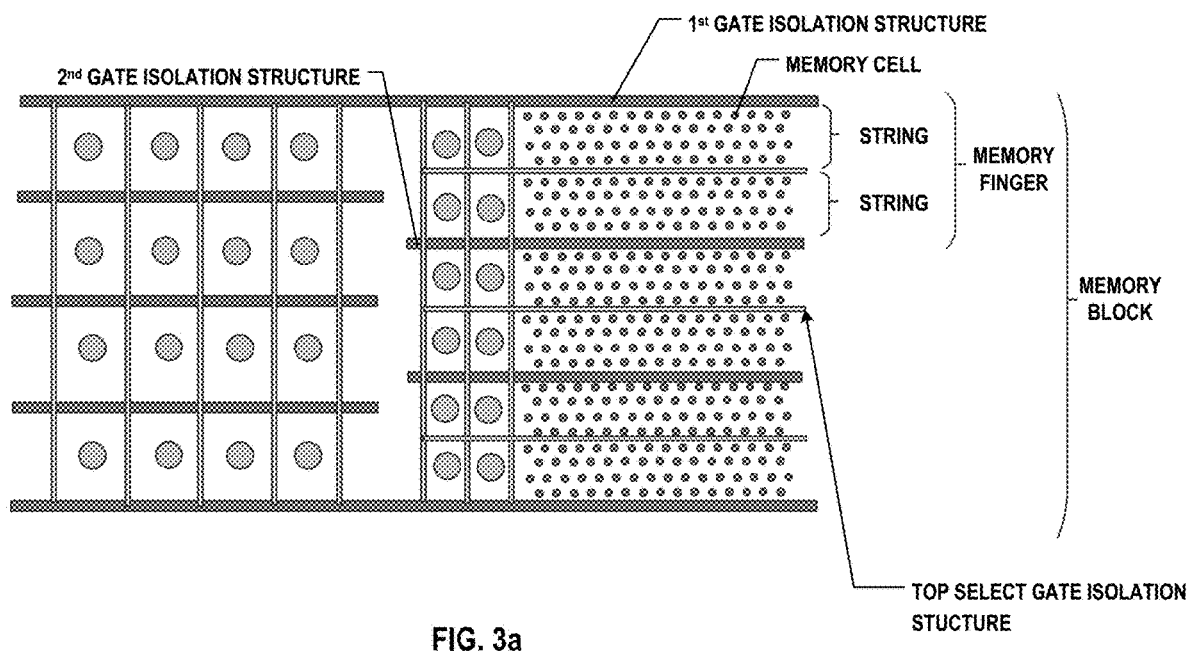
FIG. 3a is a schematic diagram of the distribution of memory cells in a three-dimensional NAND memory according to an implementation of the disclosure.

FIG. 3a illustrates a schematic structure diagram of a memory array of a three-dimensional NAND memory, and as shown in FIG. 3a, the memory array of the three-dimensional NAND memory is composed of several rows of memory cell parallel to the gate isolation structure and staggered in parallel, every four rows of memory cell are separated by a gate isolation structure and a top select gate isolation structure, and each memory cell row includes a plurality of memory cells. The gate isolation structure may include a first gate isolation structure and a second gate isolation structure, the first gate isolation structure divides the memory array into a plurality of memory blocks, and a plurality of second gate isolation structures may divide a memory block into a plurality of fingers, a top select gate isolation structure disposed in the middle of each finger may divide the finger into two parts, thereby dividing the finger into two strings. A memory block shown in FIG. 3a includes 6 strings, and in practical applications, the number of strings in a memory block is not limited to this. The memory cells in a memory block coupled to a word line may be referred to as a memory page or a physical page.

It should be noted that the number of rows of memory cell between the gate isolation structure and a top select gate isolation structure shown in FIG. 3a is just an exemplary illustration, and is not used to limit the number of rows of memory cell included in a finger of the three-dimensional NAND memory in the disclosure. In practical applications, the number of rows of memory cells included in a finger may be adjusted according to actual situations, such as 2, 4, 8, 16, etc.

Figure 3B:
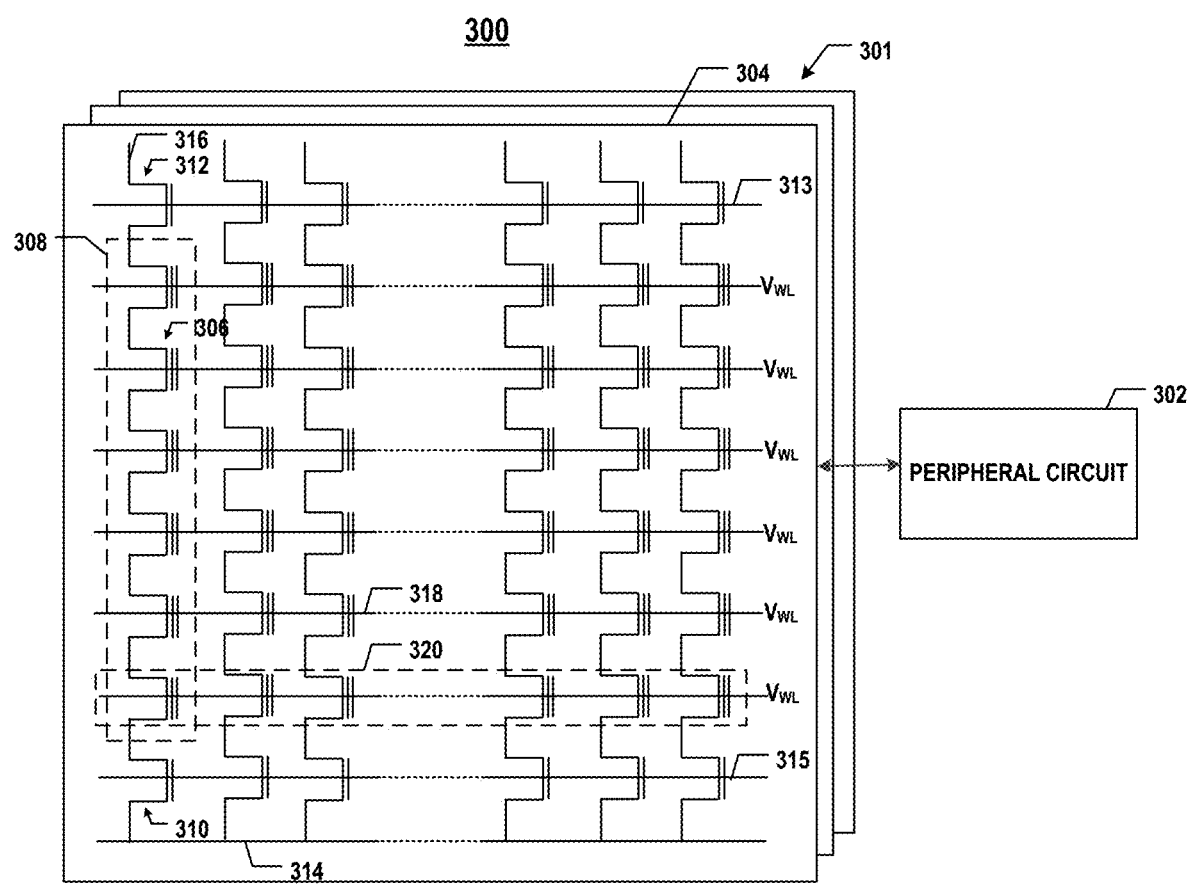
FIG. 3b is a schematic diagram of an exemplary memory device including peripheral circuits according to an implementation of the disclosure.

FIG. 3b illustrates a schematic circuit diagram of an exemplary memory device 300 including peripheral circuitry according to some aspects of the disclosure. Memory device 300 may be an example of memory device 104 in FIG. 1. The memory device 300 may include a memory array 301 and peripheral circuit 302 coupled to the memory array 301. Taking memory array 301 being a three-dimensional NAND memory array as an example for illustration, where memory cells 306 are provided in the form of an array of NAND memory strings 308, each of NAND memory strings extending vertically over a substrate (not shown). In some implementations, each of NAND memory strings 308 includes a plurality of memory cells 306 coupled in series and stacked vertically. Each of memory cells 306 may retain a continuous analog value, e.g., voltage or charge, depending on the number of electrons trapped within area of the memory cell 306. Each of memory cells 306 may be a floating gate type of memory cell including a floating gate transistor, or a charge trap type of memory cell including a charge trap transistor.

In some implementations, each of memory cells 306 is a single-level cell (SLC) that has two possible memory state and may thus store one bit of data. For example, a first memory state of "0" may correspond to a first voltage range, and a second memory state of "1" may correspond to a second voltage range. In some implementations, each of memory cells 306 is a multi-level cell (MLC) that may store more than a single bit of data in more than four memory state. For example, MLCs may store two bits per cell, three bits per cell (also known as triple-level cells (TLC)), or four bits per cell (also known as quad-level cells (QLC)). Each MLC may be programmed to employ a range of possible nominal storage values. In one example, if each MLC stores two bits of data, the MLC may be programmed to employ one of three possible programming levels from the erased state through writing one of three possible nominal storage values into the cell. A fourth nominal storage value may be used for the erased state.

As shown in FIG. 3b, each of NAND memory strings 308 may include a lower select gate (BSG) 310 at its source terminal and an upper select gate (TSG) 312 at its drain terminal. BSG 310 and TSG 312 may be configured to activate a selected NAND memory string 308 during the read and program operation. In some implementations, the sources of NAND memory strings 308 in a same memory block 304 are coupled through a same source line (SL) 314 (e.g., a common SL). In other words, according to some implementations, all NAND memory strings 308 in a same memory block 304 have an array common source (ACS). According to some implementations, TSG 312 of each of NAND memory strings 308 is coupled to a corresponding bit line (BL) 316 from or to which data may be read or written via an output bus (not shown). In some implementations, each of NAND memory strings 308 is configured to be selected or deselected through applying a select voltage (e.g., above the threshold voltage of a transistor with a TSG 312) or a deselect voltage (e.g., 0V) to the corresponding TSG 312 via one or more TSG lines 313 and/or applying a select voltage (e.g., above the threshold voltage of a transistor with a BSG 310) or a deselect voltage (e.g., 0V) to the corresponding BSG 310 via one or more BSG lines 315.

As also shown in FIG. 3b, NAND memory string 308 may be organized into a plurality of memory blocks 304, each of which may have a common source line 314 (e.g., coupled to ground). In some implementations, each of memory blocks 304 is the basic data unit for an erase operation, i.e., all memory cells 306 on the same memory block 304 are erased simultaneously. To erase the memory cell 306 in the selected memory block, source line 314 coupled to selected memory block and to unselected memory blocks in the memory plane (which are the same as selected memory block) may be biased with an erase voltage (Vers) (e.g., a high positive voltage (e.g., 20V or higher)). It may be understood that, in some examples, erase operations may be performed at the half-memory block level, at the quarter-memory block level, or at a level with any suitable number of memory blocks or any suitable fraction of memory blocks. Memory cells 306 of adjacent NAND memory strings 308 may be coupled through a word line 318 that selects which row of memory cells 306 is affected by the read and program operation. In some implementations, each of word lines 318 is coupled to a memory page 320 of memory cells 306, memory page 320 is the basic data unit for program operations. The size of a memory page 320 in bits may be related to the number of NAND memory strings 308 coupled through word line 318 in a memory block 304. Each word line 318 may include a plurality of control gates (gate electrodes) at each of memory cells 306 in a respective memory page 320 and a gate line coupling the control gates. Combined with the above FIG. 3a, a memory page 320 includes a plurality of memory cells 306, the plurality of memory cells are separated by an upper select gate isolation structure and a gate isolation structure, and a plurality of memory cells between a top select gate isolation structure and the gate isolation structure are arranged into a plurality of rows of memory cell, and each memory cell row is parallel to the gate isolation structure and a top select gate isolation structure. Memory cells in a memory string sharing a same word line form a programmable (read/write) page.

Figure 4:
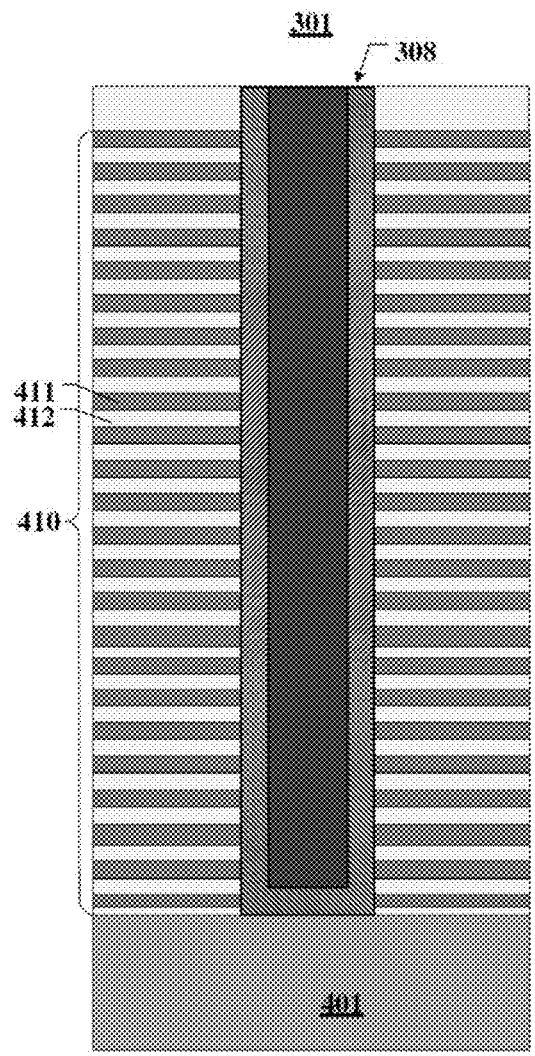
FIG. 4 is a schematic cross-sectional view of a memory array including NAND memory strings according to an implementation of the disclosure.

FIG. 4 illustrates a schematic cross-sectional view of an exemplary memory array 301 including NAND memory strings 308 according to some aspects of the disclosure. As shown in FIG. 4, the NAND memory string 308 may include a stacked structure 410, the stacked structure 410 includes a plurality of gate layers 411 and a plurality of insulating layers 412 alternately stacked in sequence, and memory string 308 vertically penetrating through gate layers 411 and insulating layers 412. Gate layers 411 and the insulating layers 412 may be stacked alternately, and two adjacent gate layers 411 are separated by an insulating layer 412. The number of pairs of gate layer 411 and insulating layer 412 in the stacked structure 410 may determine the number of memory cells included in the memory array 301.

A constituent material of the gate layer 411 may include a conductive material. Conductive materials include, but are not limited to, tungsten (W), cobalt (Co), copper (Cu), aluminum (Al), polysilicon, doped silicon, silicide, or any combination thereof. In some implementations, each of gate layers 411 includes a metal layer, e.g., a layer of tungsten. In some implementations, each gate layer 411 includes a doped polysilicon layer. Each of gate layers 411 may include a control gate surrounding a memory cell. A gate layer 411 at the top of a stacked structure 410 may extend laterally as a top select gate line, a gate layer 411 at the bottom of a stacked structure 410 may extend laterally as a lower select gate line, and a gate layer 411 extending laterally between an upper select gate line and a lower select gate line may be served as a word line layer.

In some implementations, a stacked structure 410 may be disposed on a semiconductor layer 401. The semiconductor layer 401 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

In some implementations, NAND memory string 308 includes a channel structure extending vertically through stacked structure 410. In some implementations, a structure of a channel includes a channel hole filled with semiconductor material(s) (e.g., as a semiconductor channel) and dielectric material(s) (e.g., as a memory film). In some implementations, a semiconductor channel includes silicon, e.g., polysilicon. In some implementations, a memory film is a composite dielectric layer including a tunneling layer, a storage layer (also referred to as a "charge trapping/storage layer"), and a memory blocking layer. A channel structure may have a cylindrical shape (e.g., a pillar shape). According to some implementations, a semiconductor channel, a tunneling layer, a storage layer and a memory blocking layer are radially arranged in this order from the center of the pillar toward the outer surface of the pillar. A tunneling layer may include silicon oxide, silicon oxynitride, or any combination thereof. A storage layer may include silicon nitride, silicon oxynitride, or any combination thereof. A memory blocking layer may include silicon oxide, silicon oxynitride, high dielectric constant (high k) dielectric, or any combination thereof. In an example, a memory film may include a composite layer of silicon oxide/silicon oxynitride/silicon oxide (ONO).

Figure 5:
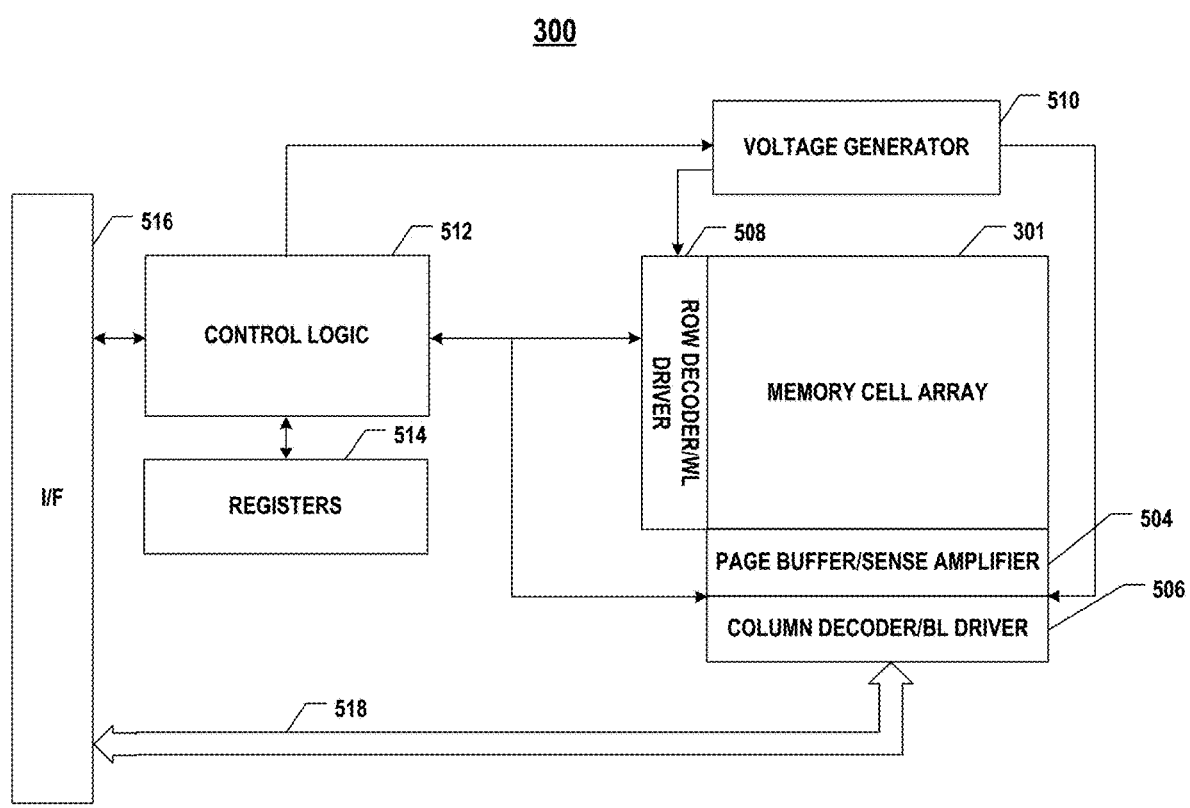
FIG. 5 is a schematic diagram of an exemplary memory device including memory arrays and peripheral circuits according to an implementation of the disclosure.

Referring back to FIG. 3b, peripheral circuit 302 may be coupled to memory array 301 through bit line 316, word line 318, source line 314, BSG line 315, and TSG line 313. Peripheral circuit 302 may include any suitable analog, digital, and mixed-signal circuitry for facilitating operation of the memory array 301 through applying a voltage signal and/or a current signal to and sensing voltage signal and/or current signal from each of target memory cells 306 via bit line 316, word line 318, source line 314, BSG line 315, and TSG line 313. The peripheral circuit 302 may include various types of peripheral circuits formed with metal-oxide-semiconductor (MOS) technology. For example, FIG. 5 illustrates some exemplary peripheral circuits. Peripheral circuit 302 includes page buffer/sense amplifier 504, column decoder/bit line driver 506, row decoder/word line driver 508, voltage generator 510, control logic unit 512, register 514, interface 516 and data bus 518. it may be understood that in some examples, additional peripheral circuits not shown in FIG. 5 may also be included.

The page buffer/sense amplifier 504 may be configured to read data from and program (write) data to the memory array 301 according to control signals from the control logic unit 512. In one example, the page buffer/sense amplifier 504 may store a page of programming data (written data) to be programmed into one memory page 320 of the memory array 301. In another example, page buffer/sense amplifier 504 may perform a programming verify operation to ensure that data has been correctly programmed into memory cell 306 coupled to selected word line 318. In yet another example, page buffer/sense amplifier 504 may also sense a low power signal from bit line 316 representing a data bit stored in memory cell 306 and amplify a small voltage swing to a recognizable logic level during a read operation. Column decoder/bit line driver 506 may be configured to be controlled by control logic unit 512 and to select one or more NAND memory strings 308 through applying a bit line voltage generated from voltage generator 510.

Row decoder/word line driver 508 may be configured to be controlled by control logic unit 512 and select/deselect memory block 304 of memory array 301 and select/deselect word line 318 of memory block 304. Row decoder/word line driver 508 may also be configured to drive word line 318 with a word line voltage generated from voltage generator 510. In some implementations, the row decoder/word line driver 508 may also select/deselect and drive the BSG line 315 and the TSG line 313. As described in detail below, the row decoder/word line driver 508 is configured to perform program operation on the memory cells 306 coupled to the selected word line(s) 318. The voltage generator 510 may be configured to be controlled by the control logic unit 512, and generate word line voltage (e.g., read voltage, program voltage, pass voltage, local voltage, verify voltage, etc.), bit line voltage and source line voltage to be supplied to the memory array 301.

Control logic unit 512 may be coupled to each of the peripheral circuits described above and configured to control operations of each of the peripheral circuits. Register 514 may be coupled to the control logic unit 512 and include state register, command register and address register for storing state information, command operation code (OP code) and command address for controlling operations of each of the peripheral circuits. Interface 516 may be coupled to control logic unit 512 and act as a control buffer to buffer and relay control commands received from a host (not shown) to control logic unit 512 and to buffer and relay state information received from the control logic unit 512 to the host. Interface 516 may also be coupled to column decoder/bit line driver 506 via data bus 518 and act as a data I/O interface and data buffer to buffer and relay data to/from memory array 301.

Universal flash storage is a new generation of embedded flash technology that represents both a storage standard and a class of storage devices that use the storage standard. Compared with traditional disks, UFS storage devices have advantages of high performance, low energy consumption, anti-vibration, and small size, therefore have obvious advantages and are widely used in embedded devices such as mobile phones and tablets.

In some specific examples, a memory device in general-purpose flash storage includes at least one die, each die includes a plurality of memory planes, and each of memory planes includes a plurality of memory blocks. Due to the large number of memory blocks in the memory device, managing each of memory blocks individually will result increased complexity and reduced efficiency for managing. Therefore, a set of a plurality of memory blocks located at the same position in each of memory planes of at least one die in the memory device forms a virtual memory block (VB), and the memory blocks are allocated and used in the unit of virtual memory block, so as to reduce the complexity for managing the memory block.

When the problem of recovering from abnormal power-off is to be solved in general-purpose flash storage products, an important step is to find a first page that is in an erased state in the currently selected virtual memory block, which may also be understood as an empty page. Data may be recovered only through finding the position of the first page that is in an erased state, and obtaining a programmable position next to the first page. Therefore, how to efficiently find a first page that is in an erased state after an abnormal power off becomes an urgent problem to be solved.

Since firmware generally organizes physical memory blocks into virtual memory blocks for management, it is necessary to know the position in two dimensions, row and column, when searching for a first page in an erased state in a virtual memory block. Due to the characteristics of flash memory, when programming, it is written in the order of page 0, page 1, page 2, . . . , which just meets the necessary conditions of binary search, i.e., it must be an ordered sequence. Usually, a firmware will use binary search for searching in the column direction to quickly find the position of a boundary between a non-empty page and an empty page in a certain column.

Binary search, also known as bisearch, is an efficient search method, which requires that the linear table must employ a sequential storage structure, and the elements in the table are arranged in order. The time complexity of binary search is O=log 2(n), which is a logarithmic function, where n is the length of a search sequence. When searching for the first page in the erased state in the selected virtual memory block, n is related to the number of layers of the 3D NAND stack. As the number of layers in the 3D NAND stack increases, the number of n will increase, which will also increase the time complexity of the binary search, and each time the number of searching is increased, the time consumption of a NAND read operation will be correspondingly added. In a method provided by an implementation of the disclosure, a first page in an erased state is searched within the range of a memory block.

Figure 6:
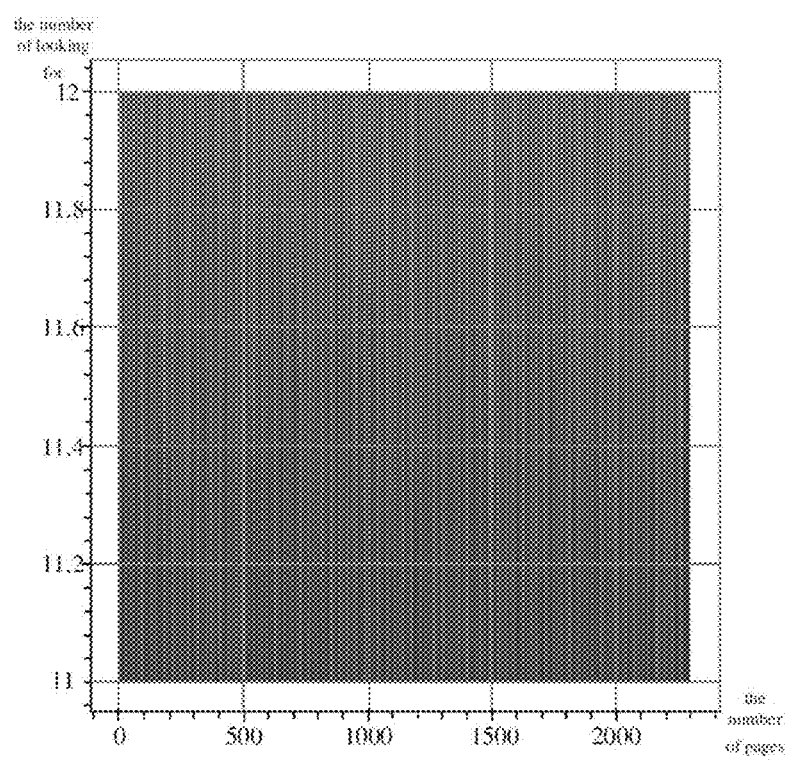
FIG. 6 is a first schematic diagram of the relationship between the number of pages and the number of searching provided by an implementation of the disclosure.
Figure 7:
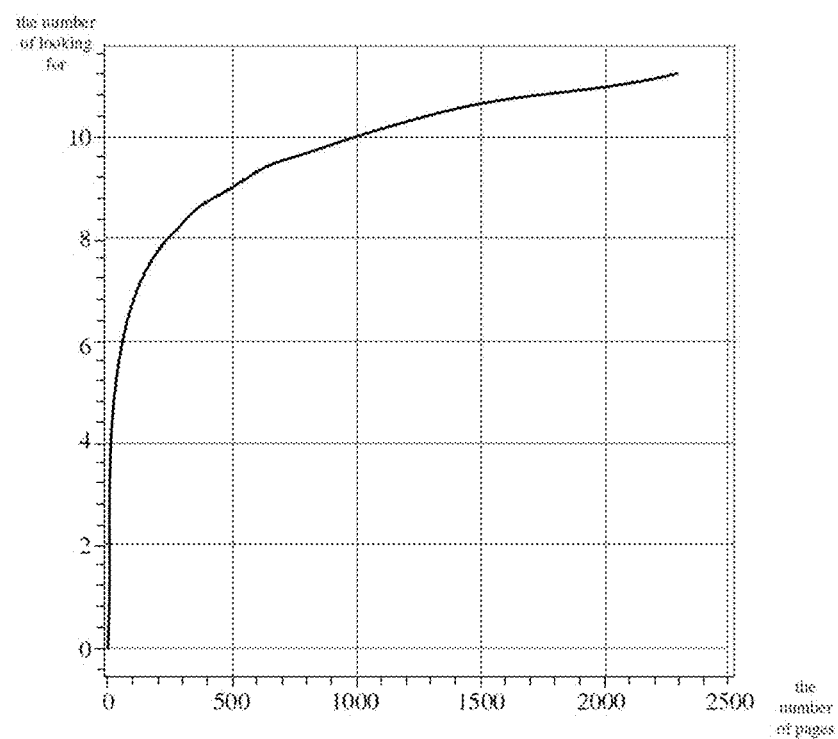
FIG. 7 is a second schematic diagram of the relationship between the number of pages and the number of searching provided by an implementation of the disclosure.

FIGS. 6 and 7 show the relationship between the number of pages and the number of searching under software simulation. As shown in FIG. 6, assuming that there are 2304 pages in a memory block, and the first page in an erased state is between page 0-page 2303, the number of searching required is 11 or 12. As shown in FIG. 7, the number of searching and the search range meet a logarithmic relationship with base 2, and the smaller the search range, the less the number of searching. The number of pages in a memory block is generally fixed, thus when searching in the range of the memory block, the search range is larger, and the search times are higher. Therefore, how to further improve search efficiency and reduce the number of searching has become an urgent problem to be solved.

Figure 8:
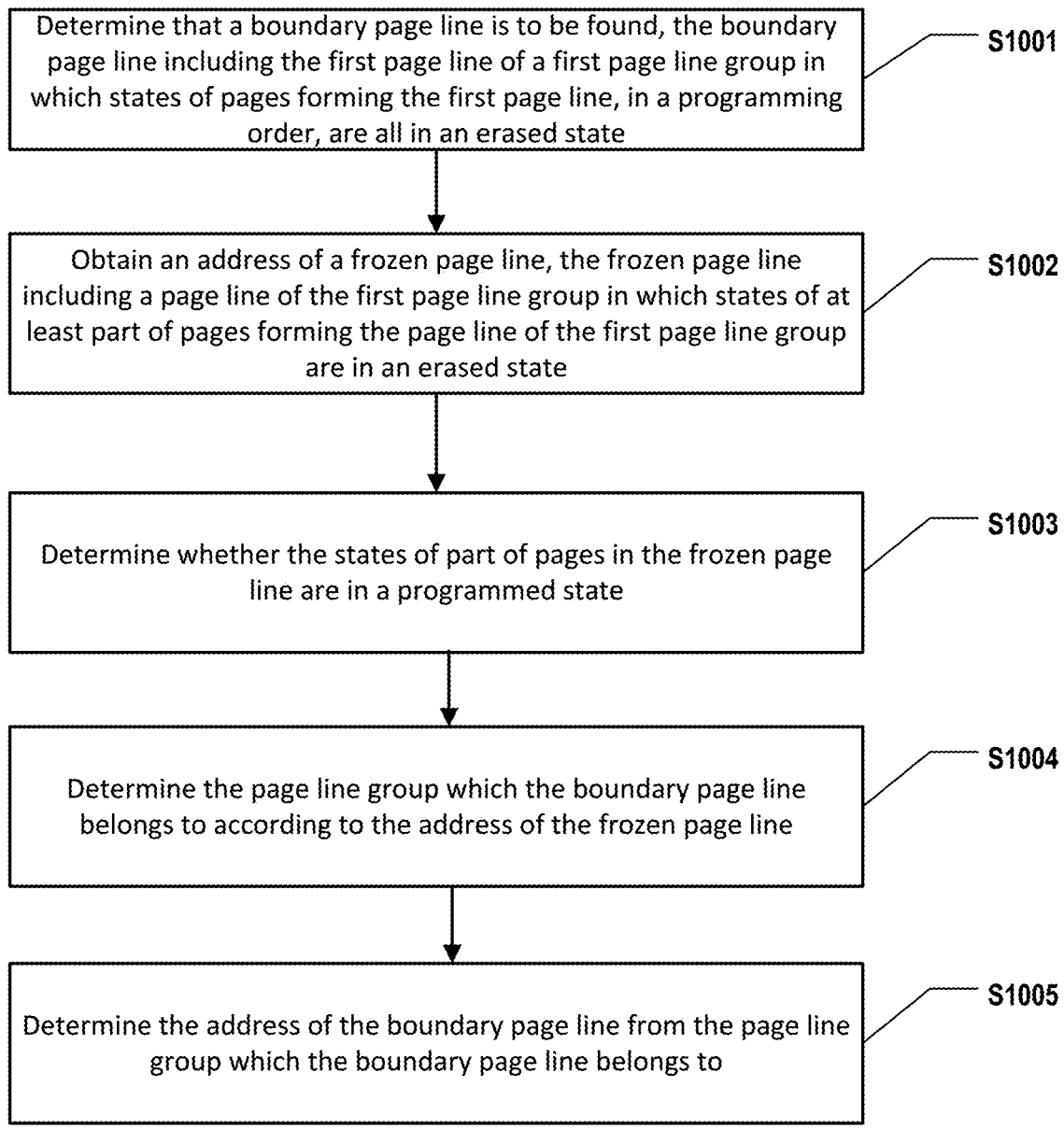
FIG. 8 is a schematic diagram of an implementation flow of a method of operating a memory system according to an implementation of the disclosure.

Based on the problems described above, an implementation of the disclosure provides another method for operating a memory system, as shown in FIG. 8, the method includes:

Step S1001: determining a boundary page line to be found, the boundary page line including a first page line in which states of the pages are all erased state in the page lines in a programming order;

Step S1002: obtain an address of a frozen page line, the frozen page line including a first page line in which states of at least part of the pages are erased state in a first page line group;

Step S1003: determining that the states of the pages in the frozen page line are all programmed state;

Step S1004: determining the page line group to which the boundary page line belongs according to the address of the frozen page line;

Step S1005: determining an address of the boundary page line from the page line group to which the boundary page line belongs.

In step S1001, it is mainly related to determining a boundary page line to be found.

In some specific examples, the memory system includes a memory device and a memory controller coupled to the memory device; the memory device includes at least one die, and the die includes a memory array; wherein, the memory array includes a plurality of memory planes, the memory plane includes a plurality of memory blocks, and the memory block includes a plurality of pages; a plurality of pages located at the same position in each of memory planes in at least one die form a page line, and a plurality of adjacent page lines form a page line group.

The same position here may be understood as follows: if there are a plurality of dies in a memory device, each die has the same structure and includes a plurality of memory planes, and a plurality of memory planes have the same structure, that is to say, the structure of each of memory planes in the memory device is the same, the same position here may refer to the same position of the physical position seen from the same perspective, on the basis of each of memory planes are seen as having the same structure.

Figure 9:
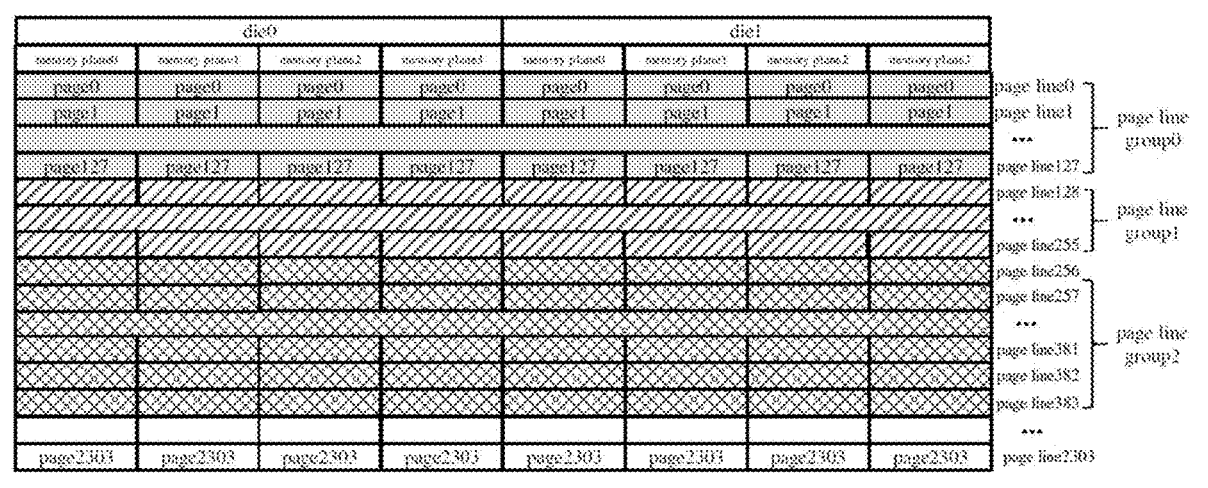

FIG. 9 is a schematic diagram that illustrates a memory device in a memory system according to an exemplary implementation. Pages, page lines, page line groups, and boundary page lines are described in detail below in conjunction with FIG. 9.

FIG. 9 exemplarily illustrates an instance where a memory device includes two dies (die 0, die 1), and one die includes four memory planes (memory plane 0-memory plane 3), each of memory planes includes a plurality of memory blocks, FIG. 9 only illustrates pages in one of the memory blocks (i.e., a virtual memory block) located at the same position in each of memory planes of the two dies, and it is exemplarily shown the case where each of memory blocks includes 2304 pages (page 0-page 2303). It should be noted that what is shown in FIG. 9 is only an exemplary illustration, and is not used to limit the number of dies, memory planes, and pages in the memory device.

The page here is related to the programming type of the memory cell. When the programming type of the memory cell is SLC, one memory cell corresponds to one page; when the programming type of the memory cell is MLC, one memory cell corresponds to two pages; when the programming type of the memory cell is TLC, one memory cell corresponds to three page; when the programming type of the memory cell is QLC, one memory cell corresponds to four pages. FIG. 9 illustrates pages in a virtual memory block when the programming type of the memory cell is QLC. The page types corresponding to page 0-page 3 shown in FIG. 9 are different, i.e., upper page, middle page, lower page, and extra page, respectively; the page types corresponding to page 4-page 7 are different, i.e., upper page, middle page, next page, extra page, respectively.

Here, a plurality of pages located at the same position in each of memory planes in at least one die form a page line. It may be understood that a same type of pages in a same memory cell in a same memory block in each of memory planes of Die 0 and Die 1 form a page line. For example, pages 0 in each of memory planes of the two dies form page line 0, and pages 1 in each of memory planes of the two dies form page line 1. The memory block shown in FIG. 9 includes page 0-page 2303, a total of 2304 pages. Thus, a virtual memory block contains page line 0-page line 2303, a total of 2304 page lines, where page line 0-page line 3 all correspond to a first physical page, and page line 4-page line 7 all correspond to a second physical page adjacent to the first physical page.

When a firmware is written, a certain number of page lines are referred to as a page line group, i.e., a plurality of adjacent page lines forming a page line group. For example, assuming that a page line group contains information of 4096 nodes, and one page stores information of 4 nodes, then in the case where a memory device includes 2 dies, and each die includes four memory planes, 128 page lines are referred to as a page line group, as shown in FIG. 9, page line 0-page line 127 form page line group 0, and page line 128-page line 255 form page line group 1. It should be noted that the number of page lines in a page line group shown in FIG. 9 is only exemplary, and is not intended to limit the number of page lines in a page line group of an implementation of the disclosure.

Here, the boundary page line includes a first page line in which states of the pages are all erased state in the page lines in a programming order. As shown in FIG. 9, when page line group 0 has finished the program operation, and page line group 1 is performing a program operation when the power is off, then a first page line in which the states of the pages in the page line group 1 are all erased state is the boundary page line.

In some specific examples, the programming will be performed in a certain order, and the programming order here may be programming in order or programming in reverse order. Here, the programming in order here may be understood as starting programming from the physical page coupled with the word line close to BSG 310 in FIG. 3b, to the physical page coupled with the word line close to TSG 312, row by row; the programming in reverse order may be understood as starting programming from the physical page coupled with the word line close to TSG 312 in FIG. 3b, to the physical page coupled with the word line close to BSG 310, row by row. As shown in FIG. 9, page line 0-page line 3 corresponds to the first physical page, and in the programming in order, the first physical page corresponds to the physical page coupled with the word line close to BSG 310; while in the programming in reverse order, the first physical page corresponds to the physical page coupled with the word line close to TSG 310. In the pages of the QLC shown in FIG. 9, program operation will be performed sequentially in the order of the first physical page, the second physical page, . . . , and for a plurality of memory planes corresponding to the same physical page, program operation will be performed sequentially in the order of memory plane 0, memory plane 1, memory plane 2, memory plane 3.

In step S1002, it is mainly related to obtaining an address of the frozen page line.

Here, the frozen page line including a first page line in which states of at least part of the pages are erased state in a first page line group. For example, when the program operation of page line group 0 is finished, the next page line 128 to be programmed in page line group 1 is used as a frozen page line.

In some implementations, the method further includes: performing program operation on each of page lines in the programming order before determining a boundary page line to be found; and when state of each of page lines in a current page line group is programed state, storing an address of a first page line in a page line group next to the current page line group in the global directory of page as the address of the frozen page line.

Here, the state of each of page lines in the current page line group is programmed state. It may be understood that all the pages in the current page line group have all finished the program operation, and a page line group next to the current page line group is the page line group that is performing a program operation when the power is off.

Here, when a page line group finishes a program operation, a memory controller will store the Logical address To Physical address (L2P) mapping table hierarchically. For example, the L2P table is stored in Page Table Entry (PTE) and Page Middle Directory (PMD), and the programming position, i.e., the position of the frozen page line, is stored in the global directory of page (PGD). Before determining a boundary page line to be found, an address of frozen page line is stored in the global directory of page line, and after determining a boundary page line to be found, an address of frozen page line is obtained from the global directory of page line.

In step S1003, it is mainly related to determining that the states of the pages in the frozen page line are all programmed states.

Here, the states of the pages in the frozen page line are all programmed states, which may be understood that a plurality of pages in the frozen page line have all finished programming and are all non-empty pages. That is, when the power is off, program operation is performed on other page lines in the page line group to which the frozen page line belongs.

In step S1004, it is mainly related to determining the page line group to which the boundary page line belongs according to the address of the frozen page line.

Here, after the address of the frozen page line is determined, it may be determined which page line group the frozen page line belongs to according to the corresponding relationship between the page line and the page line group, in turn determining the page line group which the boundary page line belongs to.

In step S1005, it is mainly related to determining the address of the boundary page line from the page line group to which the boundary page line belongs.

It may be understood that in an implementation of the disclosure, when searching for an address of the boundary page line within the range of a page line group, since the number of page lines in a page line group is relatively small, the search range for searching for boundary page lines may be reduced, thereby reducing the number of searching and improving the efficiency of searching.

In some implementations, determining an address of the boundary page line from the page line group to which the boundary page line belongs includes determining an address of the boundary page line from the page line group to which the boundary page line belongs by binary search.

The following describes in detail how to use the binary search method to search for a boundary page line.

In some implementations, determining, by binary search, an address of the boundary page line from the page line group to which the boundary page line belongs includes: determining an address of the first page line and an address of the last page line within the page line group to which the boundary page line belongs; taking the first page line as the first page line for searching by binary search, and take the last page line as the last page line for searching by binary search; determining a first page line in which states of pages include an erased state within the page line group to which the boundary page line belongs; and determining an address of the boundary page line according to the first page line in which states of pages include an erased state within the page line group to which the boundary page line belongs.

FIG. 10 exemplarily illustrates a process diagram of binary search. FIG. 10 exemplarily illustrates that the search range is 9, the states of the first 6 page lines are non-empty, and the states of the last three page lines are empty, but the search range is not limited to the case shown in FIG. 10. As shown in FIG. 10, the first step is to determine that page states of page line 0, page line 4, and page line 8 are non-empty, non-empty, and empty, respectively, thus it may be determined that the first empty page line is between the 5th page line and the 8th page line; the second step is to search between the 5th page line and the 8th page line, and determine that the states of the pages of the 5th page line and the 6th page line are non-empty and empty, respectively, thus it may be determined that the 6th page line is the first empty page line.

It should be understood that in the implementation of the disclosure, on the basis of the search range is narrowed down, then searching by binary search may further improve search efficiency and reduce the number of searching.

It should be noted that the method for determining an address of the boundary page line from the page line group to which it belongs includes but not limited to the binary search described in the above implementations. In some specific examples, the method for determining an address of the boundary page line may also be a traversing method.

The following will describe in detail how to determine the boundary page line after determining the first page line in which states of pages include an erased state within the page line group to which the boundary page line belongs.

In some implementations, determining an address of the boundary page line according to the first page line in which states of pages include an erased state within the page line group to which the boundary page line belongs includes: determining that states of pages in the first page line in which states of pages include an erased state within the page line group which the boundary page line belongs to are all erased state; and determining the first page line in which states of pages include an erased state within the page line group which the boundary page line belongs to as the boundary page line.

It may be understood that the states of pages in the first page line in which states of pages include an erased state within the page line group to which the boundary page line belongs are all erased state. That is, none of the pages in the first page line in which states of pages include an erased state within the page line group to which the boundary page line belongs has started programming. Therefore, the first page line in which states of pages include an erased state within the page line group which the boundary page line belongs to is the boundary page line. Since the program operation is performed sequentially in the order of memory plane 0, memory plane 1, memory plane 2 and memory plane 3, therefore, it is determined that the states of pages in the first page line in which states of pages include an erased state within the page line group which the boundary page line belongs to are all erased state; specifically, it is determined whether the first page line in which states of pages include an erased state within the page line group to which the boundary page line belongs the memory plane 0, if it belongs to the memory plane 0, it indicates that none of the pages in the first page line in which states of pages include an erased state within the page line group which the boundary page line belongs to has started programming.

In some implementations, determining an address of the boundary page line according to the first page line in which states of pages include an erased state within the page line group to which the boundary page line belongs includes: determining that states of part of pages in the first page line in which states of pages include an erased state within the page line group to which the boundary page line belongs to are erased state; and determining an address of the boundary page line according to programming type of memory cells in a memory block and the address of the first page line in which states of pages include an erased state within the page line group which the boundary page line belongs.

It may be understood that states of part of pages in the first page line in which states of pages include an erased state within the page line group to which the boundary page line belongs are erased state. That is, part of pages in the first page line in which states of pages include an erased state within the page line group which the boundary page line belongs to have been programmed, but another part of the pages in the first page line have not been programmed yet, therefore the first page line in which states of pages include an erased state within the page line group which the boundary page line belongs to is not a boundary page line, and an address of the boundary page line needs to be determined according to programming type of memory cells in a memory block and the address of the first page line in which states of pages include an erased state within the page line group which the boundary page line belongs to. In particular, an address of the boundary page line may be an address of the first page line in which states of pages include an erased state within the page line group to which the boundary page line belongs plus N, that is, the N-th page line after the first page line in which states of pages include an erased state within the page line group which the boundary page line belongs to is the boundary page line. N here is determined by the programming type of the memory cell in the memory block. For example, when the programming type of the memory cell is QLC, the number of stored bits is 4, i.e., N is 4; when the programming type of the memory cell is TLC, the number of stored bits is 3, i.e., N is 3; when the programming type of the memory cell is MLC, the number of stored bits is 2, i.e., N is 2; and when the programming type of the memory cell is SLCC, the number of stored bits is 1, i.e., N is 1.

Above describes how to search for the boundary page line when the states of the pages in the frozen page line are all programmed state. The following will describe in detail how to search for the boundary page line when the states of pages in the frozen page line are partially or all in the erased state.

In some implementations, the method further includes: determining that the states of the pages in the frozen page line are all erased state; and determining the boundary page line to be the frozen page line.

Here, when the states of pages in the frozen page line are all erased state, it means that none of the pages in the frozen page line starts program operation when the power is off, and they are all empty pages, because the frozen page line is the boundary page line. Specifically, it may be determined whether the pages in the erased state in the frozen page line belong to memory plane 0, and if they do, it means that the states of pages in the frozen page line are all erased state when the power is off.

In some implementations, the method further includes: determining that the states of part of the pages in the frozen page line are erased state; and
determining an address of the boundary page line according to programming type of memory cells in a memory block and the address of the frozen page line.

In some implementations, determining an address of the boundary page line according to programming type of memory cells in a memory block and the address of the frozen page line includes summing the address of the frozen page line and the number of stored bits of memory cells in the memory block as the address of the boundary page line.

Here, when the states of part of pages in the frozen page line are erased state, it means that a portion of the pages in the frozen page line have been programmed when the power is off. Therefore, the boundary page line is not the frozen page line, and the address of the boundary page line needs to be determined according to the programming type of memory cells in the memory block and the address of the frozen page line. Specifically, an address of the boundary page line may be the address of the frozen page line plus N. That is, the N-th page line after the frozen page line is the boundary page line. N here is determined by the programming type of the memory cell in the memory block. For example, when the programming type of the memory cell is QLC, the number of stored bits is 4, i.e., N is 4; when the programming type of the memory cell is TLC, the number of stored bits is 3, i.e., N is 3; when the programming type of the memory cell is MLC, the number of stored bits is 2, i.e., N is 2; and when the programming type of the memory cell is SLCC, the number of stored bits is 1, i.e., N is 1.

In an implementation of the disclosure, the search range of binary search is narrowed down during power-off recovery processing. A firmware program with spaced interval windows saves the position of the frozen page line and other information in the memory system. When searching for boundary page lines, the search range may be determined according to the previously saved position of the frozen page line, and the maximum search range does not exceed the number of page lines in a page line group. Assuming that a page line group contains information of 4096 nodes, and a page stores information of 4 nodes, then the binary search range in a memory device including 2 dies is 128, and the number of searching is 7; the binary search range in a memory device including 4 dies is 64, and the number of searching is 6; the binary search range in a memory device including 8 dies is 32, and the number of searching is 5.

However, when searching within the memory block range, in a memory system with the same capacity, no matter how many dies are included, the search range is 2304, and the number of searching is 11-12. Therefore, when searching for boundary page lines within the range of the page line group provided in the implementations of the disclosure described above, the search range becomes smaller, the number of searching is significantly reduced, and the number of dies is larger, the search range is smaller, thereby speeding up recovering from power-off Here, for the specific structure and composition of a memory system, reference may be made to the related structure and composition of the memory system 102 in FIG. 1 and FIG. 2a. For the sake of brevity, details will not be repeated here.

In some specific examples, the memory system includes a memory card or a solid-state drive.

Figure 11:
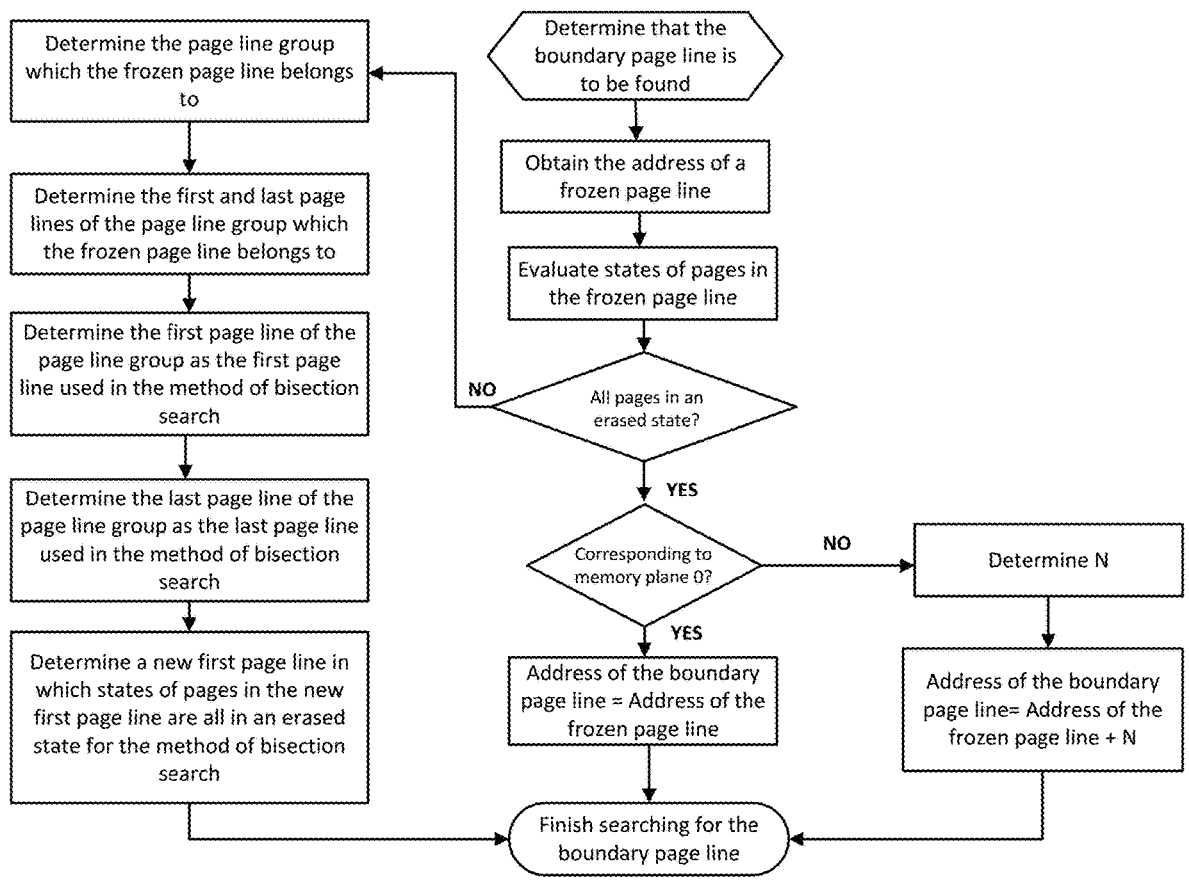
FIG. 11 is a schematic framework diagram of a method of operating a memory system according to an implementation of the disclosure.

Technical solutions of the implementations of the disclosure will be further understood in conjunction with FIG. 11 below. First, determining a boundary page line to be found, and then the position and state of the frozen page line are obtained. When the state of the frozen page line is erased state, it is determined whether the first page in which the states of pages are erased state in the frozen page line is memory plane 0, and when it belongs to memory plane 0, an address of the frozen page line is address of the boundary page line; and when it does not belong to memory plane 0, an address of the boundary page line is determined according to both the programming type of memory cells and the address of the frozen page line; when the state of the frozen page line is not erased state, the page line group to which the frozen page line belongs is determined, and the first page line and the last page line in the page line group to which the frozen page line belongs are determined, the first page line and the last page line in the page line group to which the frozen page line belongs are respectively used as the first page line and the last page line for the binary search, and a first page line in which the states of pages are all erased state found in the page line group to which the frozen page line belongs may be the boundary page line. After determining the boundary page line, the task of searching for a boundary page line ends.

An implementation of the disclosure provides a method of operating a memory system, and the method of operating a memory system includes: determining a boundary page line to be found, the boundary page line including a first page line in which states of the pages are all erased state in the page lines in a programming order; obtaining an address of a frozen page line, the frozen page line including a first page line in which states of at least part of the pages are erased state in a first page line group; determining that the states of the pages in the frozen page line are all programmed state; determining the page line group which the boundary page line belongs to according to the address of the frozen page line; determining an address of the boundary page line from the page line group which the boundary page line belongs to. In an implementation of the disclosure, page lines are divided into a plurality of page line groups. Each of page lines groups contains a plurality of page lines. Searching for a boundary page line within the scope of the page line group after power-off may narrow down search range when searching for a boundary page line, reduce the number of searches, and thus improve power-off recovery efficiency.

In the implementations described above, a method of operating a memory system is introduced, and the execution subject is a memory controller. However, in the solutions provided by implementations of the disclosure, the execution subject is not limited thereto, and may also be a peripheral circuit in a memory device.

Based on the method of operating the memory system described above, an implementation of the disclosure also provides a method for operating a memory device, the method includes: determining a boundary page line to be found, the boundary page line including a first page line in which states of the pages are all erased state in the page lines in a programming order; obtaining an address of a frozen page line, the frozen page line including a first page line in which states of at least part of the pages are erased state in a first page line group; determining that the states of the pages in the frozen page line are all programmed state;
    determining the page line group to which the boundary page line belongs according to the address of the frozen page line; and determining an address of the boundary page line from the page line group to which the boundary page line belongs.

In some specific examples, the memory device includes at least one die, and the die includes a memory array and peripheral circuits coupled to the memory array; wherein, the memory array includes a plurality of memory planes, the memory plane includes a plurality of memory blocks, and the memory block includes a plurality of pages; a plurality of pages located at the same position in each of memory planes in at least one die form a page line, and a plurality of adjacent page lines form a page line group.

In some specific examples, the memory array and the peripheral circuit are disposed on a same chip. In some other specific examples, the memory array is disposed on an array chip, and the peripheral circuit is disposed on a different chip. Specifically, it may be on a chip implemented with Complementary Metal Oxide Semiconductor (CMOS) technology and known as a CMOS chip, and array chip and the CMOS chip may be electrically coupled together with a bonding process. In some examples, a CMOS chip may be coupled with a plurality of array chips.

In some specific examples, the memory device includes three-dimensional NAND memory.

However, memory device in an implementation of the disclosure is not limited to three-dimensional NAND memory. In implementations of the disclosure, a memory device may be a semiconductor memory, including but not limited to three-dimensional NAND flash memory, vertical NAND flash memory, NOR flash memory, Dynamic Random Access Memory (DRAM), Ferroelectric Random Access Memory (FRAM), Magnetoresistive Random Access Memory (MRAM), Phase Change Random Access Memory (PCRAM), Resistive Random Access Memory (RRAM) or Nano Random Access Memory (NRAM), etc.

Here, operation method of memory devices provided in implementations described above is similar to a method of operating the memory system, and will not be repeated here. For the specific structure and composition of a memory device, reference may be made to the related structure and composition of peripheral circuit in FIG. 5. For the sake of brevity, details will not be repeated here.

It should be understood that reference throughout the description to "one implementation" or "an implementation" means that a particular feature, structure or characteristic related to the implementation is included in at least one implementation of the disclosure. Thus, appearances of "in one implementation" or "in an implementation" in various places throughout the description are not necessarily referring to a same implementation. Furthermore, these particular features, structures or characteristics may be combined in any appropriate manner in one or more implementations. it may be understood that in various implementations of the disclosure, sequence numbers of the processes described above do not mean the execution order, and the execution order of each process should be determined by its function and internal logic, and should not form any limitation to implementation process of implementations of the disclosure. The serial numbers of implementations of the disclosure described above are for the purpose of description only, and do not represent advantages and disadvantages of the implementations.

The methods disclosed in several method implementations provided in the disclosure may be combined arbitrarily without conflicts to obtain new method implementations.

The above content is only specific implementations of the disclosure, but the claimed scope of the disclosure is not limited thereto, and changes or substitutions within the technical scope disclosed in the disclosure that may be easily conceived by those skilled in art shall fall within the claimed scope of the disclosure. Therefore, the claimed scope of the disclosure should be determined by the claimed scope of the claims.

What is claimed is:

1. A memory system, comprising:
a memory device comprising at least one die, the die comprising a memory array, wherein the memory array comprises memory planes, each of the memory planes comprises memory blocks, each of the memory blocks comprises pages, multiple pages located at a same physical position in each of the memory planes form a page line, and adjacent page lines form a page line group; and
a memory controller coupled to the memory device and configured to:
determine a boundary page line to be found, the boundary page line including a first page line of the page lines in a programming order, wherein states of pages forming the first page line of the page lines in the programming order are all in an erased state, and the first page line comprises the pages of a same type that are located at a same physical position in each of the memory planes of each die;
obtain an address of a frozen page line, the frozen page line including a page line of a first page line group, wherein states of at least part of pages forming the page line of the first page line group are in an erased state;
determine the page line group to which the boundary page line belongs according to the address of the frozen page line; and
determine an address of the boundary page line from the page line group to which the boundary page line belongs.

2. The memory system according to claim 1, wherein the memory controller is further configured to:
determine the address of the boundary page line from the page line group to which the boundary page line belongs by binary search.

3. The memory system according to claim 2, wherein the memory controller is further configured to:
determine an address of a first page line and an address of a last page line of the page line group to which the boundary page line belongs;
take the first page line of the page line group to which the boundary page line belongs as a first page line for searching by the binary search, and take the last page line of the page line group to which the boundary page line belongs as a last page line for searching by the binary search;
determine a new first page line of the page line group to which the boundary page line belongs, wherein states of pages forming the new first page line of the page line group to which the boundary page line belongs include an erased state; and
determine an address of the boundary page line according to the new first page line of the page line group to which the boundary page line belongs.

4. The memory system according to claim 3, wherein the memory controller is further configured to:
determine that the states of the pages forming the first page line of the page line group to which the boundary page line belongs are all in an erased state; and
determine the first page line of the page line group to which the boundary page line belongs as the boundary page line.

5. The memory system according to claim 3, wherein the memory controller is further configured to:
determine the address of the boundary page line according to a programming type of memory cells in a memory block and the address of the first page line of the page line group to which the boundary page line belongs.

6. The memory system according to claim 1, wherein the memory controller is further configured to:
determine that the states of the pages forming the frozen page line are all in an erased state; and
determine the boundary page line to be the frozen page line.

7. The memory system according to claim 1, wherein the memory controller is further configured to:
determine that the states of part of the pages forming the frozen page line are in an erased state; and
determine the address of the boundary page line according to a programming type of memory cells in a memory block and the address of the frozen page line.

8. The memory system according to claim 7, wherein the memory controller is further configured to:
sum the address of the frozen page line and a number of stored bits of the memory cells in the memory block as the address of the boundary page line.

9. The memory system according to claim 1, wherein the memory controller is further configured to:
perform a program operation on each of the page lines according to the programming order; and
in response to a state of each of the page lines in a current page line group being in a programmed state, storing an address of a first page line of a page line group next to the current page line group in a global directory of pages as the address of the frozen page line.

10. The memory system according to claim 1, wherein the memory system comprises a memory card or a solid-state drive.

11. A memory device, comprising:
at least one die, the die comprising:
a memory array comprising memory planes, wherein each of the memory planes comprises memory blocks, each of the memory blocks comprises pages, multiple pages located at a same physical position in each of the memory planes form a page line, and adjacent page lines form a page line group; and
a peripheral circuit is configured to:
determine a boundary page line to be found, the boundary page line including a first page line of the page lines in a programming order, wherein states of pages forming the first page line of the page lines in the programming order are all in an erased state, and the first page line comprises the pages of a same type that are located at a same physical position in each of the memory planes of each die;

obtain an address of a frozen page line, the frozen page line including a page line of a first page line group, wherein states of at least part of pages forming the page line of the first page line group are in an erased state;

determine the page line group to which the boundary page line belongs according to the address of the frozen page line; and determine an address of the boundary page line from the page line group to which the boundary page line belongs.

12. The memory device according to claim 11, wherein the memory device comprises a three-dimensional NAND type memory.

13. A method for operating a memory system, comprising:

determining a boundary page line to be found of a memory device of the memory system, the boundary page line including a first page line of page lines in a programming order, wherein states of pages forming the first page line of the page lines in the programming order are all in an erased state, and the first page line comprises pages of a same type that are located at a same physical position in each of memory planes of each die in the memory device;

obtaining an address of a frozen page line, the frozen page line including a page line of a first page line group, wherein states of at least part of pages forming the page line of the first page line group are in an erased state;

determining the page line group to which the boundary page line belongs according to the address of the frozen page line; and determining an address of the boundary page line from the page line group to which the boundary page line belongs.

14. The method of claim 13, wherein determining the address of the boundary page line from the page line group to which the boundary page line belongs comprises determining the address of the boundary page line from the page line group to which the boundary page line belongs by binary search.

15. The method of claim 14, wherein determining the address of the boundary page line from the page line group to which the boundary page line belongs by the binary search comprises:

determining an address of a first page line and an address of a last page line of the page line group to which the boundary page line belongs;

taking the first page line of the page line group to which the boundary page line belongs as a first page line for searching by the binary search, and taking the last page line of the page line group to which the boundary page line belongs as a last page line for searching by the binary search;

determining a new first page line of the page line group to which the boundary page line belongs, wherein states of pages forming the new first page line of the page line group to which the boundary page line belongs include an erased state; and determining the address of the boundary page line according to the new first page line of the page line group to which the boundary page line belongs.

16. The method of claim 15, wherein determining the address of the boundary page line according to the first page line in which all the states of the pages include an erased state within the page line group to which the boundary page line belongs comprises:

determining that the states of the pages forming the first page line of the page line group to which the boundary page line belongs are all in an erased state; and determining the first page line of the page line group to which the boundary page line belongs as the boundary page line.

17. The method of claim 15, wherein determining the address of the boundary page line according to the first page line in which all the states of the pages include an erased state within the page line group to which the boundary page line belongs, comprises:

determining the address of the boundary page line according to a programming type of memory cells in a memory block and the address of the first page line of the page line group to which the boundary page line belongs.

18. The method of claim 13, further comprising:

determining that the states of the pages in the frozen page line are all in an erased state; and determining the boundary page line to be the frozen page line.

19. The method of claim 13, further comprising:

determining that the states of part of the pages forming the frozen page line are in an erased state; and determining the address of the boundary page line according to a programming type of memory cells in a memory block and the address of the frozen page line.

20. The method of claim 19, wherein determining the address of the boundary page line according to the programming type of the memory cells in the memory block and the address of the frozen page line comprises summing the address of the frozen page line and a number of stored bits of the memory cells in the memory block as the address of the boundary page line.

* * * * *